United States Patent
Kerr et al.

(10) Patent No.: US 11,460,872 B2
(45) Date of Patent: Oct. 4, 2022

(54) HIGH VOLTAGE MEASUREMENT SYSTEM AND CALIBRATION METHOD

(71) Applicant: G & W ELECTRIC COMPANY, Bolingbrook, IL (US)

(72) Inventors: Blair S. Kerr, Downers Grove, IL (US); Stefan Micic, Bolingbrook, IL (US)

(73) Assignee: G & W ELECTRIC COMPANY, Bolingbrook, IL (US)

( * ) Notice: Subject to any disclaimer, the term of this patent is extended or adjusted under 35 U.S.C. 154(b) by 892 days.

(21) Appl. No.: 16/196,284

(22) Filed: Nov. 20, 2018

(65) Prior Publication Data

US 2020/0159266 A1    May 21, 2020

(51) Int. Cl.
G05F 1/46 (2006.01)
H02B 1/20 (2006.01)

(52) U.S. Cl.
CPC ........ *G05F 1/46* (2013.01); *H02B 1/20* (2013.01)

(58) Field of Classification Search
CPC ..................................... G05F 1/46; H02B 1/20
USPC ......................................................... 307/112
See application file for complete search history.

(56) References Cited

U.S. PATENT DOCUMENTS

| | | | |
|---|---|---|---|
| 5,534,782 A | 7/1996 | Nourse | |
| 7,274,974 B2 | 9/2007 | Brown et al. | |
| 7,519,438 B2 | 4/2009 | Barbour et al. | |
| 7,616,419 B2 | 11/2009 | Koyama et al. | |
| 8,065,099 B2 | 11/2011 | Gibala et al. | |
| 2008/0232977 A1* | 9/2008 | Pan | F04B 49/065 417/44.11 |
| 2012/0019965 A1* | 1/2012 | Faxvog | H02H 3/52 361/627 |
| 2013/0238267 A1* | 9/2013 | Tziouvaras | G01R 33/12 702/65 |
| 2014/0126100 A1* | 5/2014 | Jung | H02H 3/021 361/185 |
| 2015/0349511 A1* | 12/2015 | Kojovic | H02H 3/28 361/36 |
| 2015/0355237 A1* | 12/2015 | Kutzner | G01R 1/36 324/110 |
| 2016/0154051 A1* | 6/2016 | Watson | G01R 15/14 324/552 |
| 2016/0301200 A1 | 10/2016 | Niehoff | |
| 2016/0329701 A1* | 11/2016 | Bandel | H02H 3/04 |
| 2017/0307718 A1* | 10/2017 | Timmons | G01R 35/005 |
| 2018/0366937 A1* | 12/2018 | Smith | H02H 3/05 |

\* cited by examiner

*Primary Examiner* — Alfonso Perez Borroto
(74) *Attorney, Agent, or Firm* — Michael Best & Friedrich LLP

(57) ABSTRACT

Voltage measurement calibration methods and junction circuits. In one embodiment, the junction circuit includes a capacitor and a voltage adjustment circuit. The junction circuit is electrically coupled to an output of a capacitive voltage divider circuit. The capacitor is electrically coupled between the output of the capacitive voltage divider circuit and a reference terminal. The voltage adjustment circuit is electrically coupled between the output of the capacitive voltage divider circuit and an output of the junction circuit. The voltage adjustment circuit includes an adjustable impedance component configured to adjust a voltage gain of the voltage adjustment circuit.

20 Claims, 9 Drawing Sheets

HIGH VOLTAGE MEASUREMENT SYSTEM AND CALIBRATION METHOD

BACKGROUND

Voltage sensors are commonly used in high voltage monitoring systems. In some cases (for example, in power distribution systems having transmission and distribution voltages from 2,400 volts to 100 kilovolts), it is necessary to scale down high voltages so they can be measured.

SUMMARY

A voltage divider may be used to scale down high voltages so they can be measured by, for example, a voltmeter. In some cases, a voltage divider may be included within a voltage sensor and may be implemented using components of an electrical device (for example, switchgear in a power distribution system). The voltage ratio of a voltage divider represents the ratio between the magnitude of output signals and the magnitude of input signals. Voltage ratios of passive (non-power consuming) voltage dividers may vary due to process variations of the components used. Existing voltage measurement systems that use passive voltage sensors account for varying voltage ratios by applying a digital "ratio correction factor" (RCF) to voltage readings. A ratio correction factor is unique to a particular voltage sensor system and must be programmed into an associated meter or control to which it is wired. Such ratio correction factors may undesirable from an end user perspective because they are unique to particular voltage sensor systems and if one or more components of the voltage sensor system are replaced, the associated ratio correction factor must also be changed in a meter or controller that determines voltage from the voltage sensor system. For example, a controller may need to be re-programmed with an updated ratio correction factor for a new voltage sensor. This programming task may be difficult for the end user to perform. For example, in some instances different groups of individuals perform the equipment installations in the field and the controller programing tasks. Thus, re-programming may require coordination between at least the two groups. Additionally, the programming task may require user access to proprietary software and special programming cables.

Some embodiments provide, among other things, a junction circuit that is electrically coupled to an output of a capacitive voltage divider circuit. In one embodiment, the junction circuit includes a capacitor and a voltage adjustment circuit. The capacitor is electrically coupled between the output of the capacitive voltage divider circuit and a reference terminal. The voltage adjustment circuit is electrically coupled between the output of the capacitive voltage divider circuit and an output of the junction circuit. The voltage adjustment circuit includes an adjustable impedance component configured to adjust a voltage gain of the voltage adjustment circuit.

Another embodiment provides a switchgear system. In one example, the switchgear system includes a switchgear device, a voltage divider circuit, and a junction circuit. The voltage divider circuit includes an output and an input electrically coupled to the switchgear. The junction circuit includes an input, an output, and a voltage adjustment circuit. The input of the junction circuit is electrically coupled to the output of the voltage divider circuit. The output of the junction circuit is electrically coupleable to a voltage measurement device. The voltage adjustment circuit is configured to adjust a voltage gain of the voltage divider circuit.

Another embodiment provides a method of calibrating a recloser voltage measurement system. In one example, the recloser voltage measurement system includes a voltage divider and a voltage adjustment circuit. The voltage divider is electrically coupled to a recloser. The voltage adjustment circuit is electrically coupled to an output of the voltage divider. The method includes determining a first voltage measurement at a high voltage input to the recloser. The method also includes determining a second voltage measurement at an output of the voltage adjustment circuit. The method further includes calculating a difference between the first voltage measurement and the second voltage measurement. The method also includes determining a target voltage gain based on the determined difference between the first voltage measurement and the second voltage measurement. The method further includes adjusting a voltage ratio of the voltage divider by setting the voltage adjustment circuit to the target voltage gain.

Other aspects and embodiments will become apparent by consideration of the detailed description and accompanying drawings.

DETAILED DESCRIPTION

Figure 1:
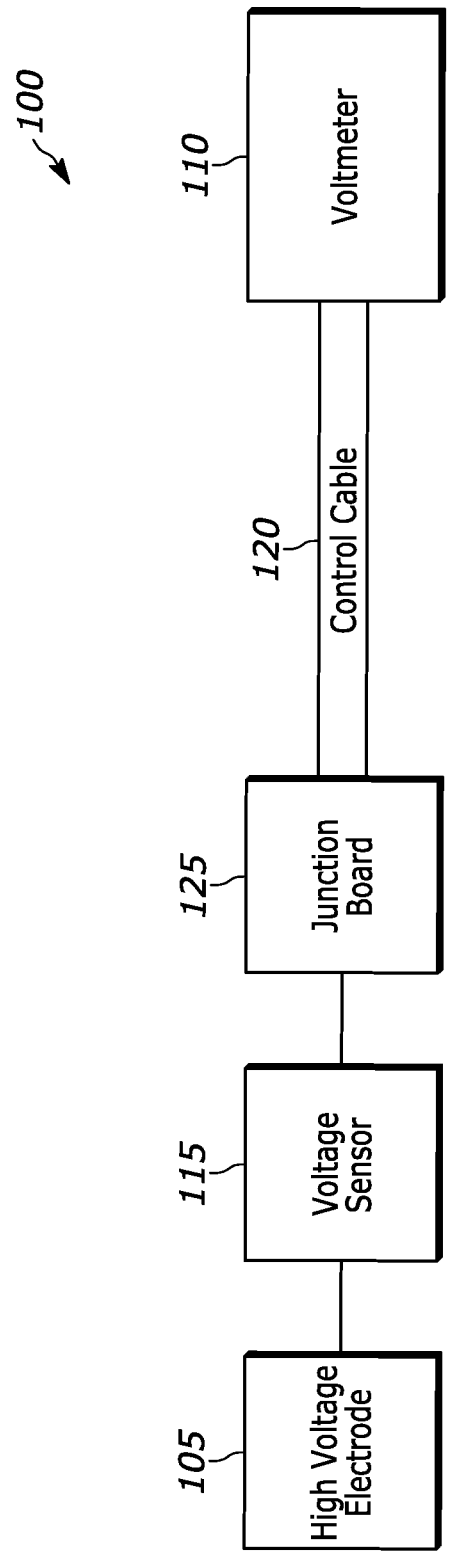
FIG. 1 is a block diagram of a high voltage monitoring system, according to some embodiments.

FIG. 1 is a block diagram of a monitoring system 100 for measuring voltage at a high voltage electrode 105, according to some embodiments. The high voltage electrode 105 may be electrically coupled to high voltage source, for example, a transmission or distribution line. The monitoring system 100 in FIG. 1 includes a voltmeter 110 which cannot directly measure high voltage from the high voltage electrode 105. Thus, a voltage sensor 115 (including a voltage divider) is electrically coupled to the high voltage electrode 105 to scale down the high voltage to a lower voltage that can be measured by the voltmeter 110. For safety or practical reasons, the voltmeter 110 may be located a distance away from the high voltage electrode 105 and the voltage sensor 115. Thus, the voltmeter 110 is electrically coupled to the high voltage electrode 105 and the voltage sensor 115 via a control cable 120. A junction board 125 (located near the voltage sensor 115) is used to electrically couple the voltage sensor 115 to the control cable 120.

As described above, the high voltage is scaled down via a voltage divider included in the high voltage electrode 105 and the voltage sensor 115. The voltage divider may be designed to measure a specified low voltage output for a specified high voltage input. For example, a high voltage input of 10 kilovolts could ideally yield a sensed low voltage output of 1 volt, for a voltage ratio of 10,000 to 1. However, due to variations in the physical layout and electrical characteristics of passive components included in the voltage divider, a unique ratio correction factor must be determined for each voltage sensor to scale the output for an accurate reading. In earlier systems, the voltage sensor 115 is tested with a high voltage input to determine a ratio correction factor based on the ratio of applied input to measured output. The ratio correction factor is provided to an end user who must program the ratio correction factor into the voltage measurement device to make the corrections. However, this prior technique presents problems for an end user. Among other problems, each time a component of the monitoring system 100 is replaced, a new ratio correction factor must be programmed into the voltmeter 110. This process requires programming expertise and additional equipment in the field that may not be readily available or possible to perform due to safety concerns or practical limitations.

Figure 2:
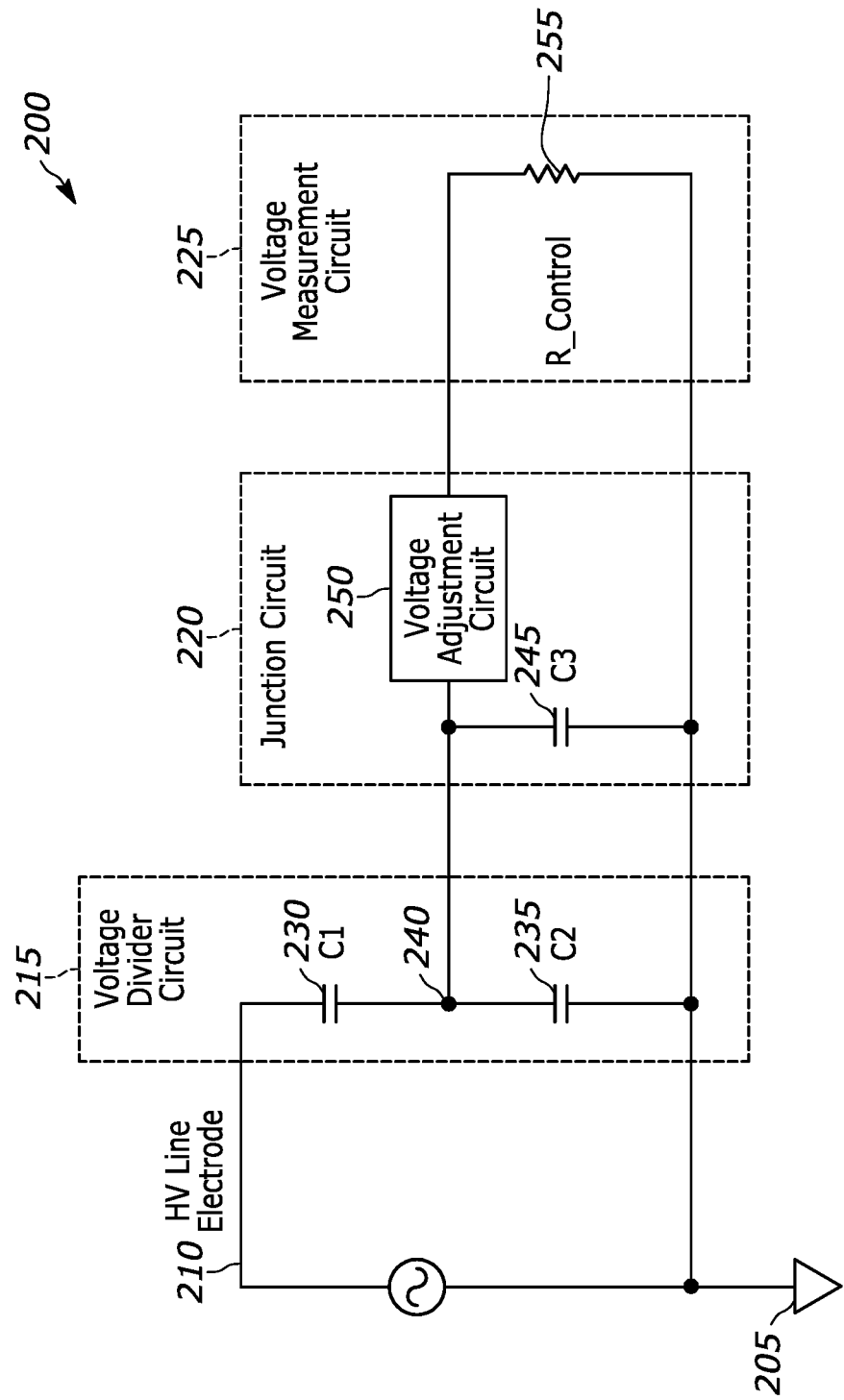
FIG. 2 is a circuit diagram of a voltage measurement system, according to some embodiments.

FIG. 2 is a circuit diagram of a voltage measurement system 200 that eliminates the need for ratio correction factors programmed into a controller, according to some embodiments. The voltage measurement system 200 in FIG. 2 includes a reference terminal 205, a high voltage (HV) line electrode 210, a voltage divider circuit 215, a junction circuit 220, and a voltage measurement circuit 225. In some embodiments, the reference terminal 205 is electrically coupled to earth ground.

The input of the voltage divider circuit 215 is electrically coupled to the HV line electrode 210 and the reference terminal 205. In some embodiments, the voltage divider circuit 215 is included in a voltage sensor (for example, the voltage sensor 115 in FIG. 1). The voltage divider circuit 215 in FIG. 2 includes a capacitor 230 (C1) electrically coupled in series with another capacitor 235 (C2) to divide the voltage drop across the HV line electrode 210 and the reference terminal 205 at a voltage screen electrode 240 (i.e., the output of the voltage divider circuit 215).

The input of the junction circuit 220 is electrically coupled to the output of the voltage divider circuit 215. In some embodiments, the junction circuit 220 is included in a junction board (for example, the junction board 125 in FIG. 1). The junction circuit 220 includes a capacitor 245 (C3) electrically coupled between the reference terminal 205 and the output of the voltage divider circuit 215 (i.e., the voltage screen electrode 240). The capacitor 245 (C3) is electrically coupled in parallel with the capacitor 235 (C2) such that the capacitor 230 (C1), the capacitor 235 (C2), and the capacitor 245 (C3) together form a capacitive voltage divider network. Ideally, the transfer function H (also known as the voltage ratio) of this capacitive voltage divider network is $$H=C\_1/(C\_1+C\_2+C\_3) \quad \text{(Equation 1)}$$

where
C_1=capacitance of the capacitor 230 (C1),
C_2=capacitance of the capacitor 235 (C2), and
C_3=capacitance of the capacitor 245 (C3).

The junction circuit 220 also includes a voltage adjustment circuit 250 electrically coupled in series with the capacitor 245 (C3) to adjust the voltage ratio of the capacitive voltage divider network. The voltage adjustment circuit 250 adjusts the voltage ratio of the capacitive voltage divider network by applying a voltage gain to the output of the capacitive voltage divider network.

The voltage measurement circuit 225 is electrically coupled to the output of the junction circuit 220. In some embodiments, the voltage measurement circuit 225 is included in a voltmeter (for example, the voltmeter 110 in FIG. 1). The voltage measurement circuit 225 in FIG. 2 includes a control resistor 255 (R_Control) representing, for example, the resistance within a voltmeter used to measure the voltage drop across the output of the voltage adjustment circuit 250 and the reference terminal 205.

Figure 3:
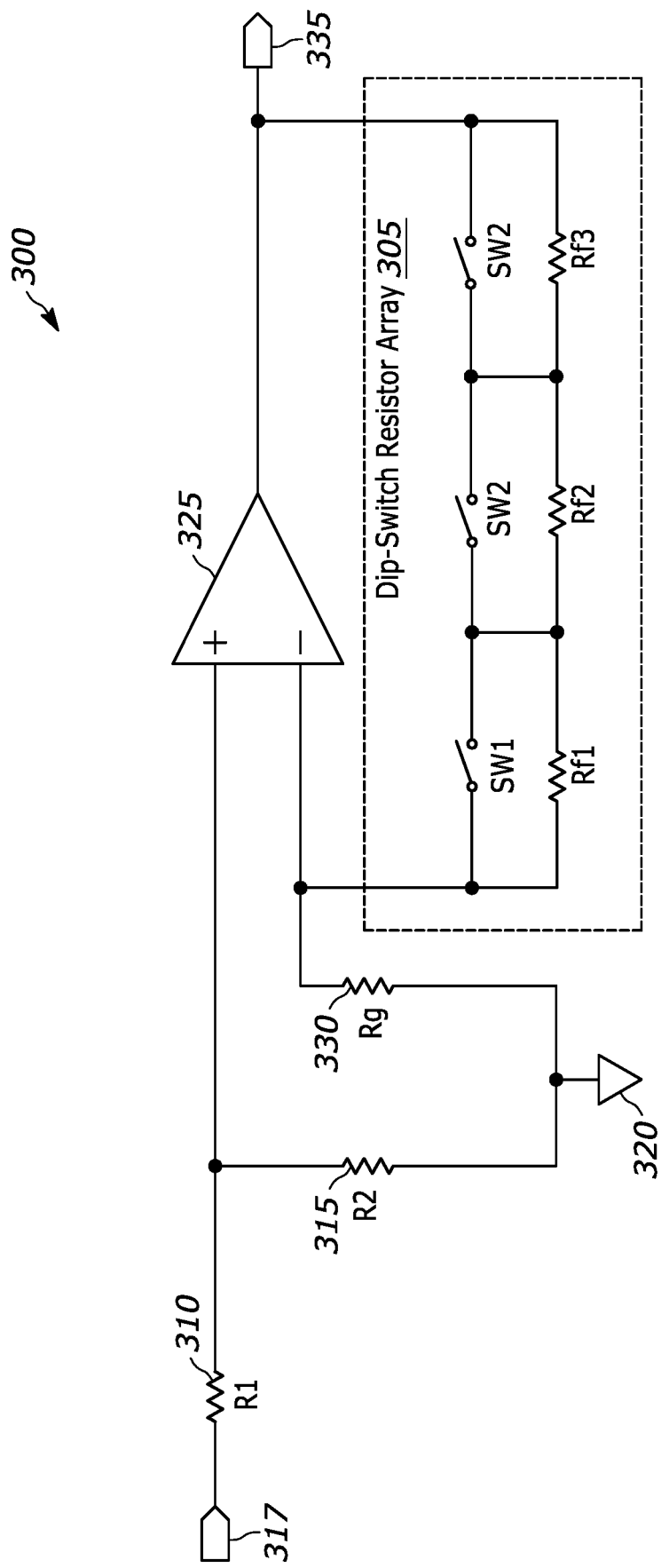
FIG. 3 is a circuit diagram of a part of a voltage adjustment circuit whose voltage gain is controlled by a dip-switch resistor array, according to some embodiments.

As described above, the voltage adjustment circuit 250 in the junction circuit 220 adjusts the voltage ratio of the capacitive voltage divider network by applying a voltage gain to the output of the capacitive voltage divider network. In some embodiments, the voltage gain of the voltage adjustment circuit 250 is controlled by an adjustable impedance component. In some embodiments, the adjustable impedance component is a dip-switch resistor array. For example, FIG. 3 is a circuit diagram of a part of a voltage adjustment circuit 300 whose voltage gain is controlled by a dip-switch resistor array 305, according to some embodiments. The voltage adjustment circuit 300 in FIG. 3 includes two resistors 310 (R1) and 315 (R2) that are electrically coupled between an input 317 and a reference terminal 320 to form a voltage divider. Ideally, the transfer function H of the voltage divider formed by the resistor 310 (R1) and the resistor 315 (R2) is $$H=R\_2/(R\_1+R\_2) \quad \text{(Equation 2)}$$

where
R_1=resistance of the resistor 310 (R1), and
R_2=resistance of the resistor 315 (R2).

The voltage adjustment circuit 300 in FIG. 3 also includes an operational amplifier 325 whose voltage gain is controlled by the dip-switch resistor array 305. The dip-switch resistor array 305 in FIG. 3 includes three resistors Rf1, Rf2, and Rf3 electrically coupled in series with each other, and three dip switches SW1, SW2, and SW3 electrically coupled in series with other. In alternate embodiments, the dip-switch resistor array 305 may include more or less resistors and/or more or less dip switches. Each dip switch in the dip-switch resistor array 305 is electrically coupled in parallel with an individual resistor. For example, the dip switch SW1 is electrically coupled is parallel with the resistor Rf1. When one of the dip switches is in a closed positioned (i.e., ON), the resistance of the parallel-coupled resistor is not included in the total resistance across the dip-switch resistor array 305 (i.e., the dip switch shorts out the parallel-coupled resistor). For example, when the dip switch SW2 is in the closed position, the resistance of the resistor Rf2 is not included in the total resistance across the dip-switch resistor array 305. Alternatively, when one of the dip switches is in an open position (i.e., OFF), the resistance of the parallel-coupled resistor is included in the total resistance across the dip-switch resistor array 305. For example, when the dip switch SW2 is in the open position, the resistance of the resistor Rf2 is included in the total resistance across the dip-switch resistor array 305. The total resistance across the dip-switch resistor array 305 (i.e., the feedback resistance of the operational amplifier 325) is set based on the positions of the three dip switches SW1, SW2, and SW3. For example, when the dip switches SW1 and SW2 are in the open position and the dip switch SW3 is in the closed position, the total resistance across the dip-switch resistor array 305 is equal to the sum of the resistances of the resistors Rf1 and Rf2. As an additional example, when the dip switch SW2 is in the open position and the dip switches SW1 and SW3 are in the closed position, the total resistance across the dip-switch resistor array 305 is equal to the resistance of the resistor Rf2.

The operational amplifier 325 is configured as a non-inverting amplifier with negative feedback. The negative feedback is provided via the dip-switch resistor array 305 and a resistor 330 (Rg) which together act as a voltage divider. The dip-switch resistor array 305 is electrically coupled between the output and the inverting input of the operational amplifier 325. The resistor 330 (Rg) is electrically coupled between the inverting input of the operational amplifier 325 and the reference terminal 320. Ideally, the closed-loop gain A_CL of the operational amplifier 325 is $$A\_CL = 1 + (R\_f/R\_g) \qquad \text{(Equation 3)}$$

where
- R_f=total resistance across the dip-switch resistor array 305, and
- R_g=resistance of the resistor 330 (Rg).

The non-inverting input of the operational amplifier 325 is electrically coupled to the output of the voltage divider formed by the resistor 310 (R1) and the resistor 315 (R2). The output of the operational amplifier 325 is electrically coupled to an output 335 of the voltage adjustment circuit 300. Thus, by combining equations 2 and 3, the voltage gain V_Gain of the voltage adjustment circuit 300 is $$V\_Gain = V\_Out/V\_In = (R\_2/[R\_1+R\_2]) \times (1+[R\_f/R\_g]) \qquad \text{(Equation 4)}$$

where
- V_Out=voltage at the output 335 of the voltage adjustment circuit 300,
- V_In=voltage at the input 317 of the voltage adjustment circuit 300,
- R_1=resistance of the resistor 310 (R1),
- R_2=resistance of the resistor 315 (R2),
- R_f=total resistance across the dip-switch resistor array 305, and
- R_g=resistance of the resistor 330 (Rg).

Figure 4:
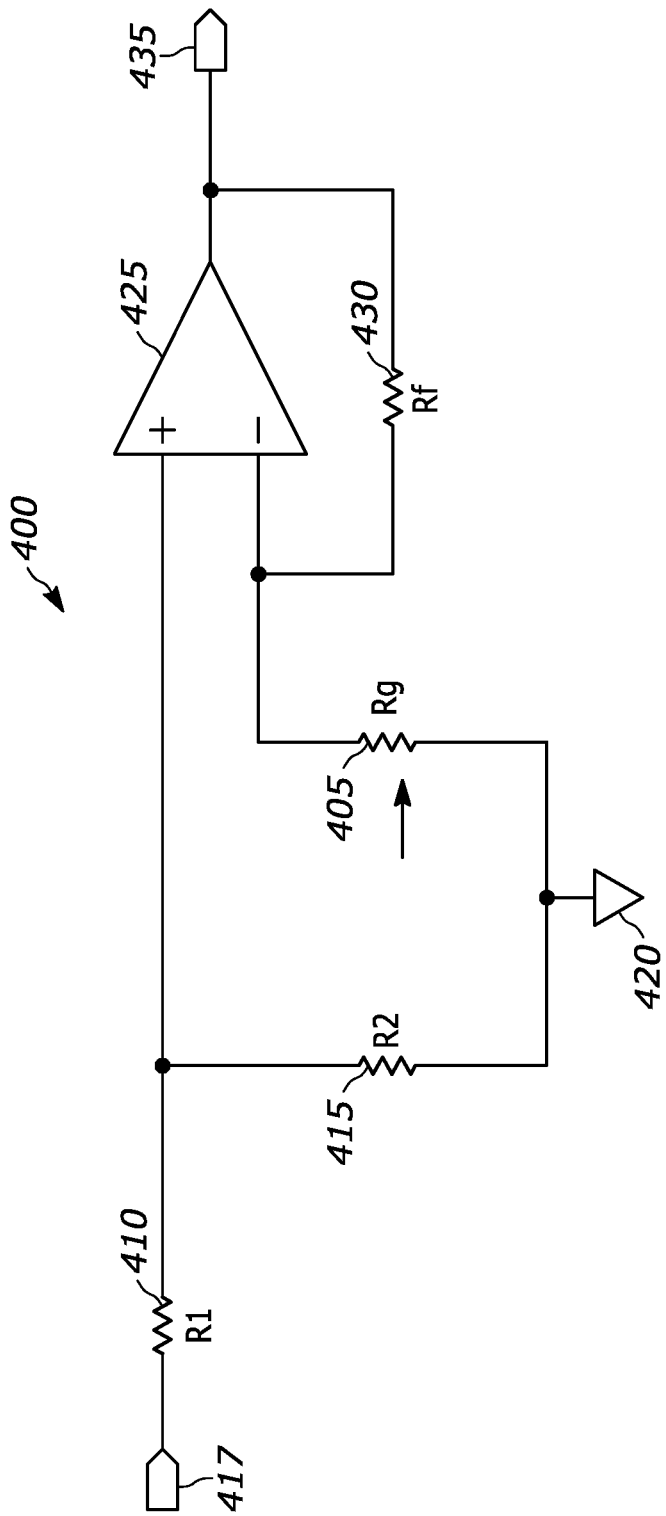
FIG. 4 is a circuit diagram of a part of a voltage adjustment circuit whose voltage gain is controlled by a digital potentiometer, according to some embodiments.

In alternate embodiments, the adjustable impedance component is a digital potentiometer. For example, FIG. 4 is a circuit diagram of a voltage adjustment circuit 400 whose voltage gain is controlled by a digital potentiometer 405 (Rg), according to some embodiments. The voltage adjustment circuit 400 in FIG. 4 includes two resistors 410 (R1) and 415 (R2) electrically coupled between an input 417 and a reference terminal 420 to form a voltage divider. Ideally, the transfer function H of the voltage divider formed by the resistor 410 (R1) and the resistor 415 (R2) is $$H = R\_2/(R\_1+R\_2) \qquad \text{(Equation 5)}$$

where
- R_1=resistance of the resistor 410 (R1), and
- R_2=resistance of the resistor 415 (R2).

The voltage adjustment circuit 400 in FIG. 4 also includes an operational amplifier 425 whose voltage gain is controlled by the digital potentiometer 405 (Rg). The operational amplifier 425 is configured as a non-inverting amplifier with negative feedback. The negative feedback is provided via the digital potentiometer 405 (Rg) and a resistor 430 (Rf) which together act as a voltage divider. The digital potentiometer 405 (Rg) is electrically coupled between the inverting input of the operational amplifier 425 and the reference terminal 420. The resistor 430 (Rf) is electrically coupled between the output and the inverting input of the operational amplifier 425. Ideally, the closed-loop gain A_CL of the operational amplifier 425 is $$A\_CL = 1 + (R\_f/R\_g) \qquad \text{(Equation 6)}$$

where
- R_f=resistance of the resistor 430 (Rf), and
- R_g=resistance of the digital potentiometer 405 (Rg).

The non-inverting input of the operational amplifier 425 is electrically coupled to the output of the voltage divider formed by the resistor 410 (R1) and the resistor 415 (R2). The output of the operational amplifier 425 is electrically coupled to an output 435 of the voltage adjustment circuit 400. Thus, by combining equations 5 and 6, the voltage gain V_Gain of the voltage adjustment circuit 400 is $$V\_Gain = V\_Out/V\_In = (R\_2/[R\_1+R\_2]) \times (1+[R\_f/R\_g]) \qquad \text{(Equation 7)}$$

where
- V_Out=voltage at the output 435 of the voltage adjustment circuit 400,
- V_In=voltage at the input 417 of the voltage adjustment circuit 400,
- R_1=resistance of the resistor 410 (R1),
- R_2=resistance of the resistor 415 (R2),
- R_f=resistance of the resistor 430 (Rf), and
- R_g=resistance of the digital potentiometer 405 (Rg).

In some embodiments, the voltage gain of the voltage adjustment circuit 250 is set to compensate for variations in the voltage ratio of the voltage divider circuit 215. Alternatively or in addition, the voltage gain of the voltage adjustment circuit 250 is set to compensate for variations in the voltage ratio of the capacitive voltage divider network formed by the voltage divider circuit 215 and the capacitor 245 (C3) in the junction circuit 220. Alternatively or in addition, the voltage gain of the voltage adjustment circuit 250 is set based on a temperature of the junction circuit 220, a temperature of the voltage divider circuit 215, or both. For example, in some embodiments, the junction circuit 220 includes a temperature sensor and sets the voltage gain of the voltage adjustment circuit 250 based on the temperature of the junction circuit 220, the temperature of the voltage divider circuit 215, or both.

The voltage measurement system 200 can be used with switchgear. Switchgear is the combination of electrical disconnect switches, fuses, and/or circuit breakers and other components used to control, protect, and isolate electrical equipment in electrical power systems. Reclosers (also known as automatic circuit reclosers or autoreclosers) are a class of switchgear designed for use on overhead electricity distribution networks to detect and interrupt momentary faults. Reclosers are designed to operate with single phase and three phase power distribution networks.

Figure 5:
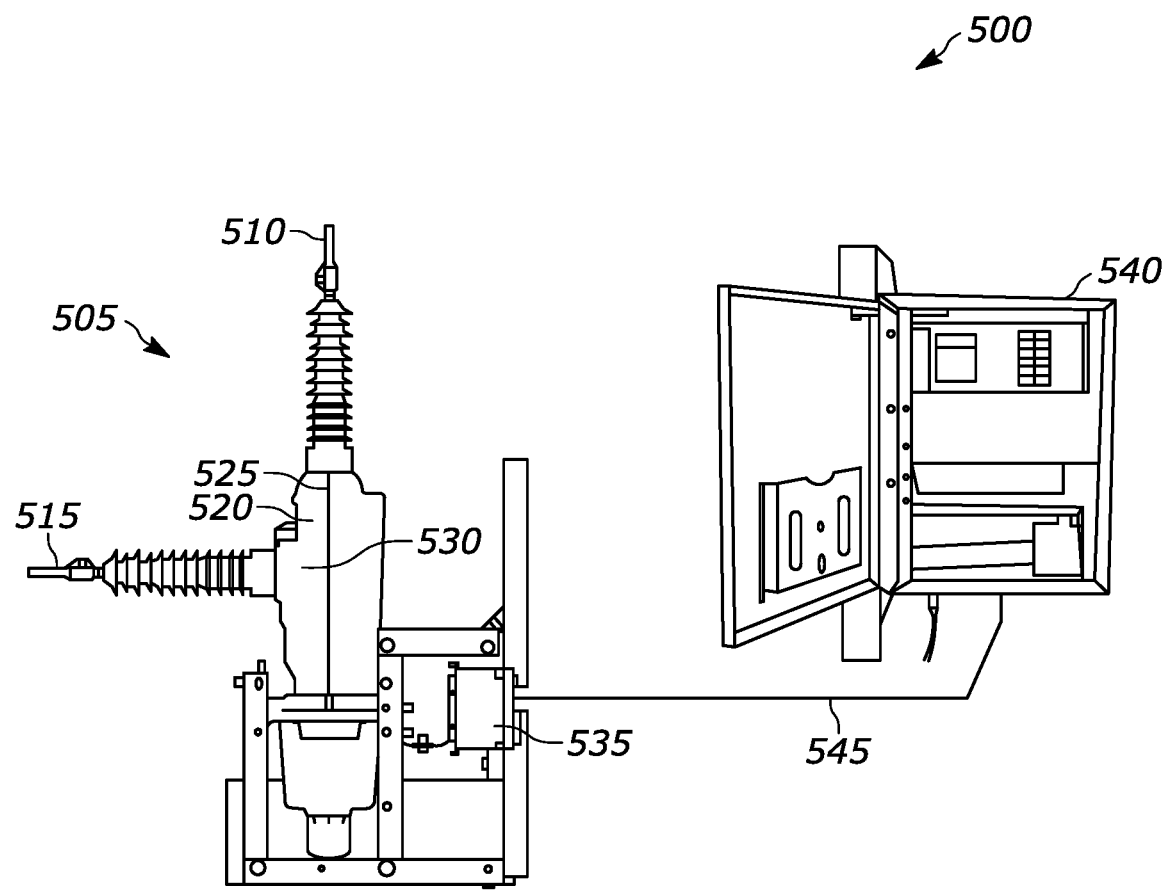
FIG. 5 is a diagram of a switchgear system including a recloser, a control cable, and a recloser controller, according to some embodiments.

FIG. 5 is a diagram of a switchgear system 500 including a recloser 505, according to some embodiments. In the example provided in FIG. 5, the recloser 505 receives high voltage electrical power via a line connection 510, and delivers the high voltage electrical power via a load connection 515. An interrupting medium 520 (for example, a vacuum interrupter) is electrically coupled between the line connection 510 and the load connection 515 to selectively interrupt current flow therebetween. Voltage at the line connection 510 is monitored by a first voltage sensor 525, and voltage at the load connection 515 is monitored by a second voltage sensor 530. The switchgear system 500 also includes a junction board 535 that is electrically coupled to the first and second voltage sensors 525 and 530. Also shown in FIG. 5 is a recloser controller 540 that is electrically coupled to the junction board 535 via a control cable 545.

The recloser 505 in FIG. 5 represents one phase of a three phase recloser. For ease of description, the other two phases of the three phase recloser are not shown or described in detail. However, the other two phases of the three phase recloser may include similar components as the recloser 505 shown in FIG. 5. For example, each of the other two phases may include a recloser interrupting medium, line and load connections, and on or two voltage sensors. In some embodiments, a three phase recloser includes two voltage sensors for each phase (i.e., a total of six voltage sensors). In some embodiments, the junction board 535 in FIG. 5 is also electrically coupled to the four voltage sensors in the other two phases (i.e., a total of six voltage sensors).

Figure 6:
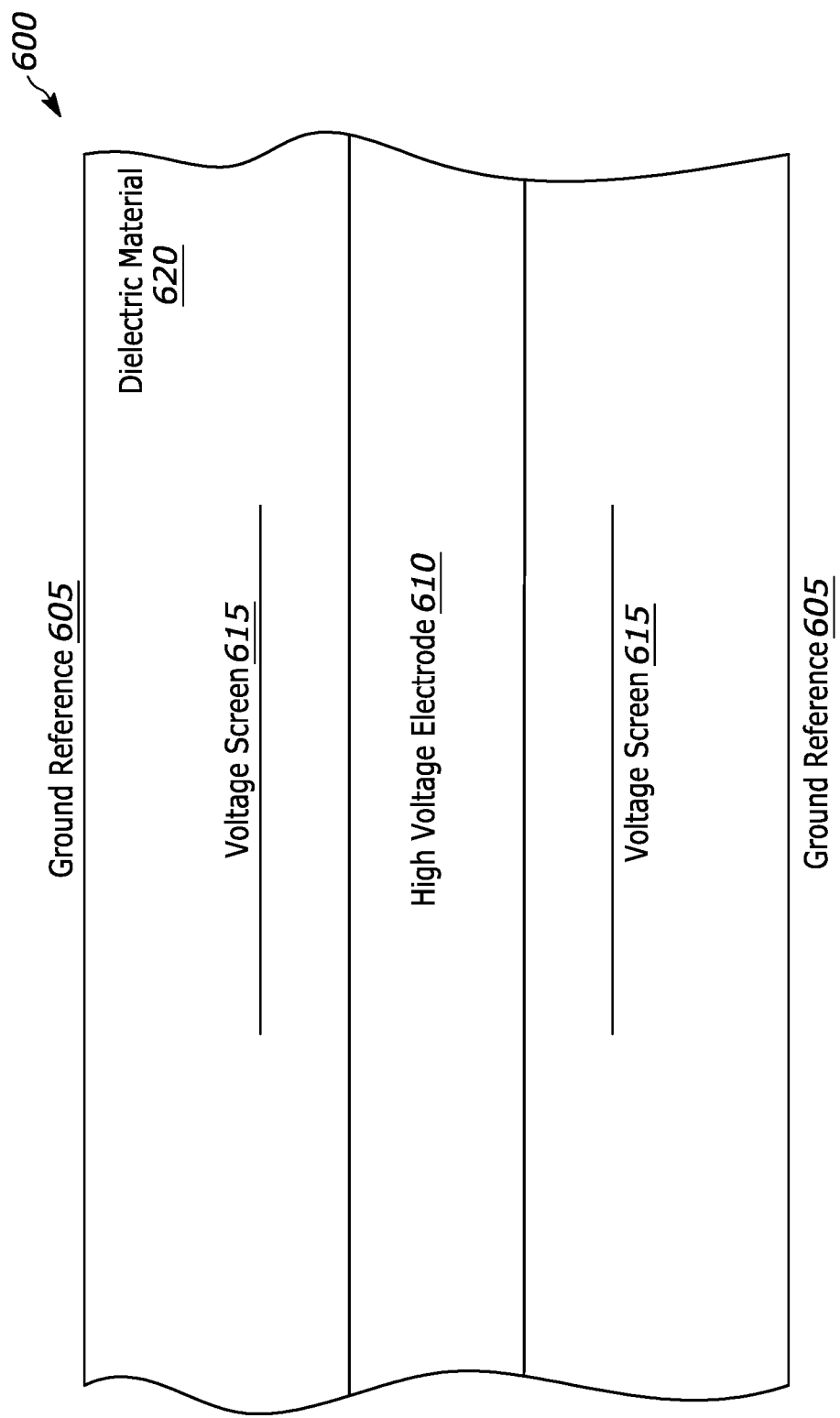
FIG. 6 is a diagram of a voltage sensor, according to some embodiments.

FIG. 6 is a diagram of one example embodiment of a voltage sensor 600 used for monitoring voltage in a power system. The voltage sensor 600 in FIG. 6 includes a ground reference 605, a high voltage (HV) electrode 610, a voltage screen 615, and dielectric material 620. In some embodiments, the ground reference 605, the HV electrode 610, and/or the voltage screen 615 are cylindrical. Components of the voltage sensor 600 in FIG. 6 correspond with components of the voltage divider circuit 215 in FIG. 2. For example, the capacitor 230 (C1) represents the capacitance between the HV electrode 610 and the voltage screen 615, and the capacitor 235 (C2) represents the capacitance between the voltage screen 615 and the ground reference 605. Thus, the voltage sensor 600 implements a voltage divider. In some embodiments, the voltage level of the ground reference 605 is held at earth ground.

Voltage sensors used in reclosers are designed to yield a target voltage ratio between the input voltage and the output voltage. For example, a voltage sensor may be designed to yield a target voltage ratio of 10,000 to 1. However, due to variations in physical layout and electrical characteristics of passive components included in the voltage sensor, the actual voltage ratio of the voltage sensor may vary from the target voltage ratio. In some present systems, a recloser controller applies a ratio correction factor to scale the output voltage for an accurate reading. As the ratio correction factor is unique to each voltage sensor, ratio correction factors are presently determined by testing each voltage sensor with a high voltage input to determine a ratio correction factor based on the voltage ratio of applied voltage input to measured voltage output. The ratio correction factors are provided to end users who must program the ratio correction factors into a recloser controller to make the corrections. Reclosers often need to be replaced. For example, reclosers may need to be replaced due to damage caused by lightning strikes or wildlife interference. Additionally, reclosers need to be replaced at their end of life or for equipment upgrades. Thus, the present method presents problems for the end users as new correction factors must be determined and programmed into a recloser controller each time a recloser (or a component of a recloser) is replaced.

To remove the need for a ratio correction factor, the junction board 535 in FIG. 5 includes the junction circuit 220 of FIG. 2. By setting the voltage gain of the voltage adjustment circuit 250, the junction circuit 220 adjusts the voltage ratio of the voltage divider to implement a target voltage ratio. As such, the recloser controller 540 does not need to apply a ratio correction factor to the readings of the voltage measurement circuit 225. In some embodiments, the ratio correction factor of the recloser controller 540 is equal to one (i.e., the recloser controller 540 effectively provides no ratio correction factor). The ratio correction factor of the recloser controller 540 may be set to one by default. Alternatively or in addition, a ratio correction factor of one may be programmed into the recloser controller 540, for example, by a user.

In some present systems, a true ratio (also known as a nameplate ratio) is programed into a recloser controller instead of a ratio correction factor. The true ratio indicates the actual voltage ratio provided by a voltage sensor system. For example, in a present system that provides an actual voltage ratio of 9,921 to one, the true ratio in the recloser controller is set to 9,921 to one. The junction circuit 220 of FIG. 2 included in the junction board 535 in FIG. 5 also removes the need for a true ratio adjustment (or true ratio programming). By setting the voltage gain of the voltage adjustment circuit 250, the junction circuit 220 adjusts the voltage ratio of the voltage divider to implement a target voltage ratio. As such, the recloser controller 540 does not need to apply a true ratio to the readings of the voltage measurement circuit 225. In some embodiments, the true ratio of the recloser controller 540 is set to the target voltage ratio (i.e., the recloser controller 540 effectively provides no true ratio). For example, when the target voltage ratio is 10,000 to one and the voltage divider provides an actual voltage ratio of 9,921 to one, the true ratio of the recloser controller 540 may be set (by default or via user programming) to 10,000 to one because of the voltage gain provided by the voltage adjustment circuit 250.

Figure 7:
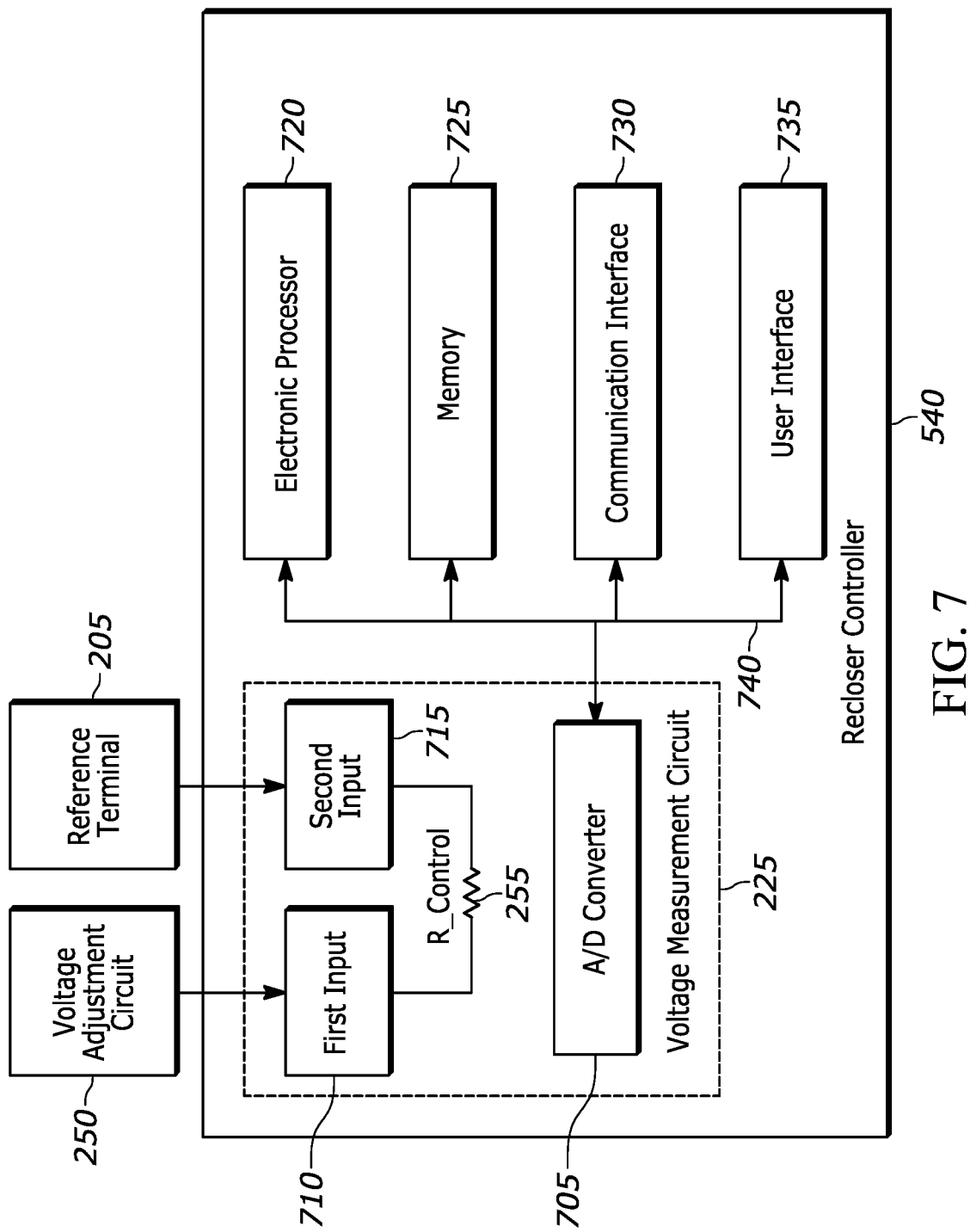
FIG. 7 is a block diagram of a recloser controller, according to some embodiments.

FIG. 7 is a block diagram of one example embodiment of the recloser controller 540. The recloser controller 540 in FIG. 7 includes the voltage measurement circuit 225 of FIG. 2. In addition to the control resistor 255 (R_Control), the voltage measurement circuit 225 in FIG. 7 includes an analog-to-digital (A/D) converter 705, a first input 710 electrically coupled to the output of the voltage adjustment circuit 250, and a second input 715 electrically coupled to the reference terminal 205. In some embodiments, the first input 710 is electrically coupled to the output of the voltage adjustment circuit 250 via one or more other components within the junction circuit 220. The recloser controller 540 in FIG. 7 also includes an electronic processor 720 (for example, a microprocessor), memory 725, a communication interface 730, a user interface 735, and bus 740. The bus 740 connects various components of the recloser controller 540, for example, the memory 725 to the electronic processor 720.

The memory 725 includes read-only memory (ROM), random access memory (RAM), electrically erasable programmable read-only memory (EEPROM), other non-transitory computer-readable media, or a combination thereof. The electronic processor 720 is configured to retrieve program instructions and data from the memory 725 and execute, among other things, program instructions to perform the methods described herein. The memory 725 may store program instructions for operating the interrupting medium 520. The memory 725 may also store data representing low voltage voltmeter readings from the voltage measurement circuit 225. The memory 725 may also store program instructions for estimating the voltage between the HV electrode 610 and the ground reference 605 based on low voltage measurements from the voltage measurement circuit 225. The memory 725 may also store data representing estimations of the voltage between the HV electrode 610 and the ground reference 605. The memory 725 may also store data representing a ratio correction factor. The memory 725 may also store data representing configuration parameters and program instructions for compensating or calibrating for any inaccuracies of the magnitude or phase of a voltage reading.

The communication interface 730 includes routines for transferring information between components within the recloser controller 540 and other components of the switchgear system 500, as well as components external to the switchgear system 500. The communication interface 730 is configured to transmit and receive signals via wires, fiber, wirelessly, or a combination thereof. Signals may include, for example, information, data, serial data, data packets, analog signals, or a combination thereof.

The user interface 735 is included to control the recloser controller 540 or the operation of a switchgear system 500 as a whole. The user interface 735 is operably coupled to the electronic processor 720 to control, for example, the state of the interrupting medium 520. The user interface 735 displays visual output generated by software applications executed by the electronic processor 720. Some examples of visual output are graphical indicators, lights, colors, text, images, and graphical user interfaces (GUIs). The user interface 735 includes a suitable display mechanism for displaying visual output (for example, a light-emitting diode (LED) screen, a liquid crystal display (LCD) screen, or an organic LED (OLED) screen). In some embodiments, the user interface 735 includes a touch sensitive interface (for example, a touch-screen display). The touch-screen display receives user input using detected physical contact (for example, detected capacitance or resistance). Based on the user input, the touch-screen display outputs signals to the electronic processor 720 which indicate positions on the touch-screen display currently being selected by physical contact. Alternatively or in addition, the user interface 735 receives user input from input devices, for example, knobs, dials, switches, buttons, and keypads.

Various configurations of the components of the recloser controller 540 may be implemented. For example, the voltage measurement circuit 225 may be integrated with the recloser controller 540 in a single housing, or may by electrically coupled to the recloser controller 540 but housed in a separate housing. In some embodiments, the voltage measurement circuit 225 and/or the recloser controller 540 may be positioned near to the interrupting medium 520, for example, near the junction board 535 or at some other location that is more accessible by a user.

Figure 8:
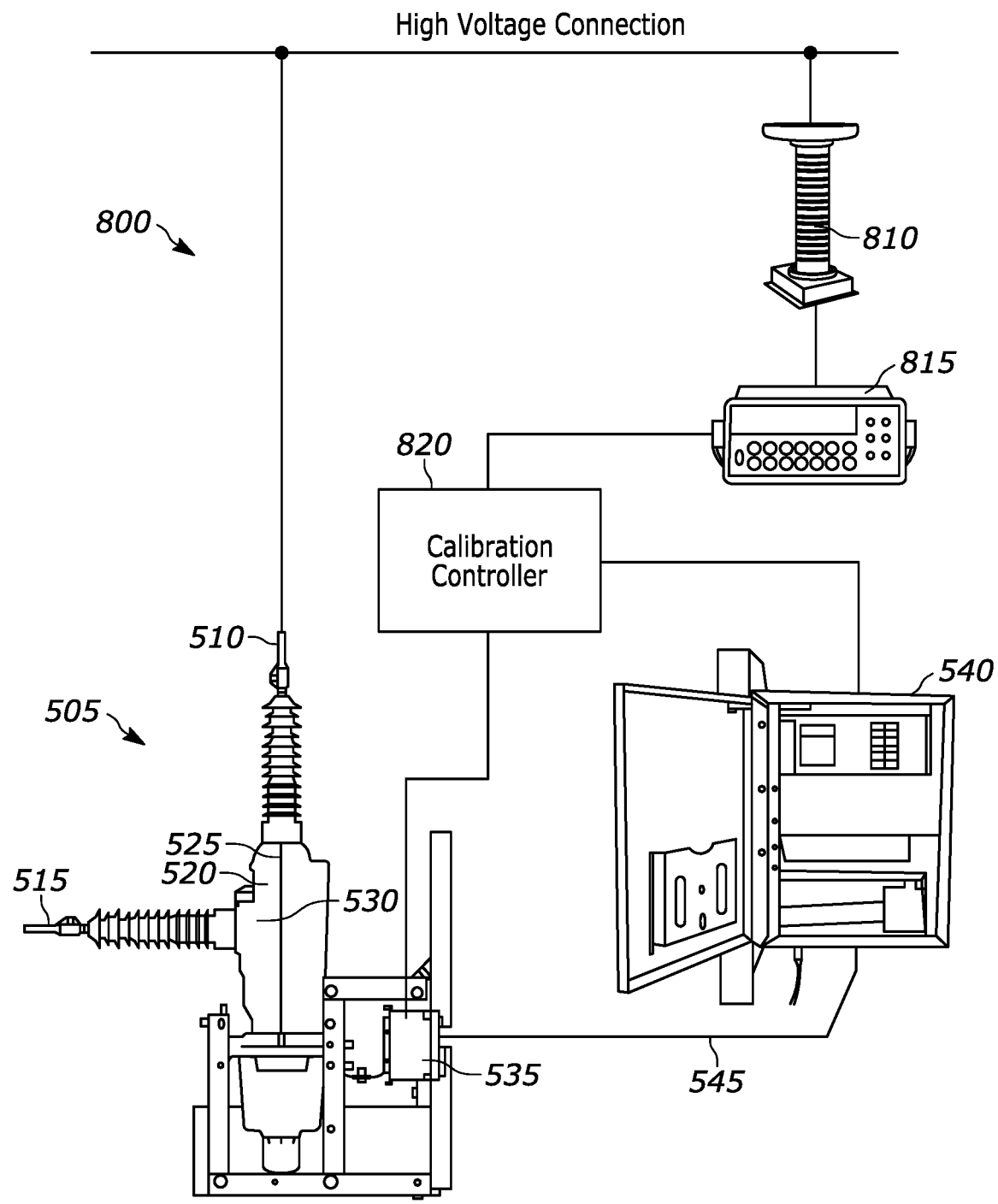
FIG. 8 is a diagram of a switchgear system for a recloser voltage measurement system, according to some embodiments.

FIG. 8 is a diagram of an example embodiment of a switchgear system 800 for calibrating a recloser voltage measurement system. In the example shown in FIG. 8, the switchgear system 800 includes the recloser 505, the junction board 535, the recloser controller 540 described previously herein. The line connection 510 of the recloser 505 is electrically coupled to a high voltage connection 805 to receive a high voltage (for example, voltages from 2,400 volts to 100 kilovolts). The switchgear system 800 in FIG. 8 also includes a voltage divider 810, a digital multimeter 815, and a calibration controller 820. The voltage divider 810 is electrically coupled to the high voltage connection 805 to provide a low voltage output proportional to the applied high voltage. The voltage divider 810 may include a reference voltage divider calibrated to provide an actual voltage ratio that is equal (or very close) to a target voltage ratio. The digital multimeter 815 (for example, the 34410A Digital Multimeter by Agilent Technologies) is electrically coupled to the voltage divider 810 to read the low voltage output. The calibration controller 820 is electrically coupled to the digital multimeter 815 to receive readings of the low voltage output. The calibration controller 820 is also electrically coupled to the recloser controller 540 to receive voltage measurements of the output of the junction circuit 220 in the junction board 535. The calibration controller 820 is further electrically coupled to the voltage adjustment circuit 250 in the junction circuit 220 (which is located in the junction board 535). The calibration controller 820 is configured to send control signals to the voltage adjustment circuit 250 which cause the voltage adjustment circuit 250 to set a target voltage gain. In some embodiments, the calibration controller 820 includes components or combinations of different components, including all or some of the various components described above with respect to the recloser controller 540. For example, the calibration controller 820 may include an electronic processor, memory, a communication interface, a user interface, specialized software, or a combination thereof. In some embodiments, the calibration controller 820 includes a laptop, a desktop, a tablet, a server, or a combination thereof.

Figure 9:
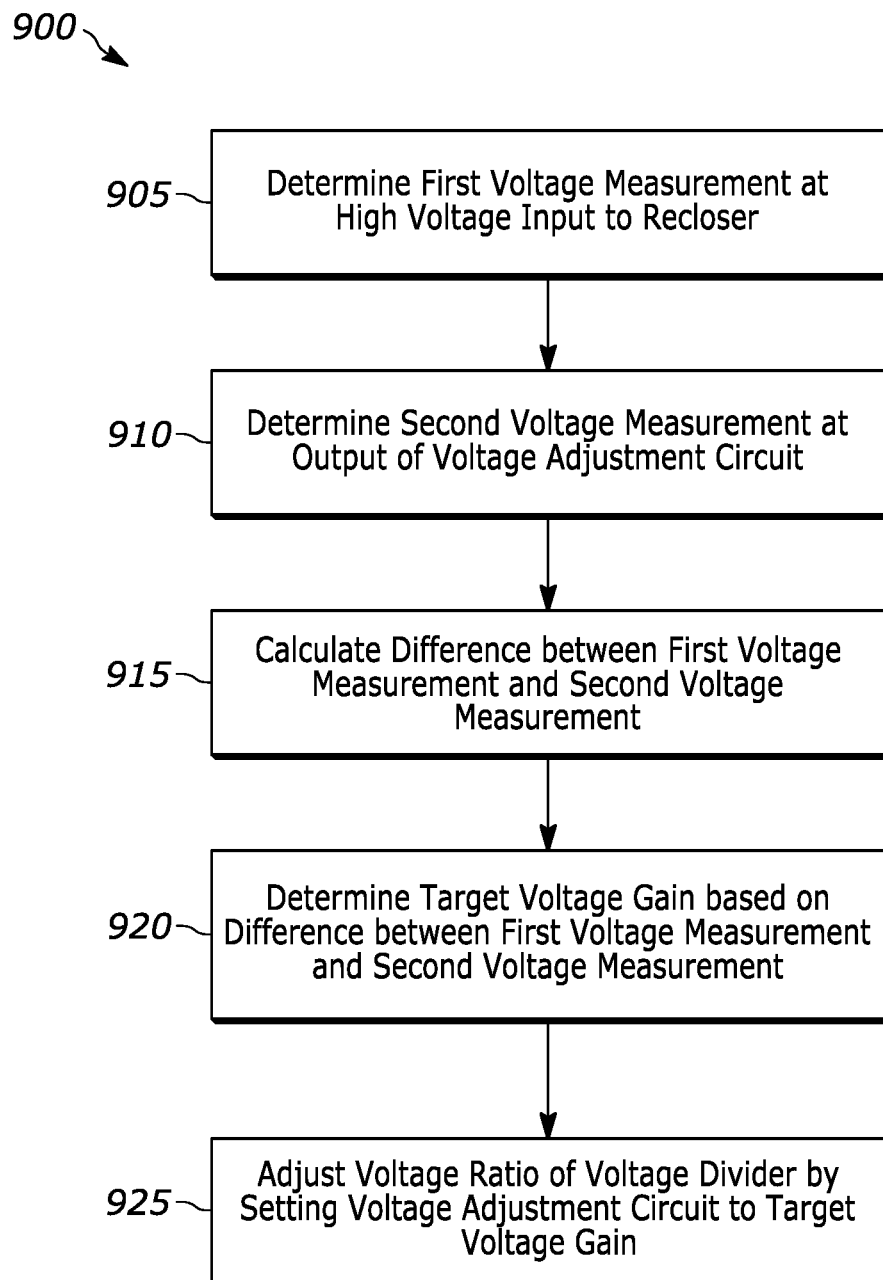
FIG. 9 is a flow chart of a method for calibrating a recloser voltage measurement system, according to some embodiments.

FIG. 9 is a flow chart of a method 900 for calibrating a recloser voltage measurement system, according to some embodiments. For ease of description, the method 900 is described in terms of calibrating the voltage adjustment circuit 250 when it is electrically coupled to the first voltage sensor 525 of the recloser 505. The same (or a similar) method may also be used to calibrate a voltage adjustment circuit that is electrically coupled to the second voltage sensor 530 of the recloser 505, or any other voltage sensor included in the recloser 505.

At block 905, a first voltage measurement at a high voltage input to the recloser 505 is determined. In some embodiments, the high voltage input is the line connection 510 of the recloser 505. For example, the calibration controller 820 may receive a reading from the digital multimeter 815 of the low voltage output produced by the voltage divider 810. This reading of the low voltage output is proportional to the applied high voltage at the high voltage connection 805. As the line connection 510 of the recloser 505 is also electrically coupled to the high voltage connection 805, this reading of the low voltage output is representative of the actual value of high voltage applied to the line connection 510 of the recloser 505. Thus, in some embodiments, the first voltage measurement represents the actual value of high voltage applied to the line connection 510 of the recloser 505, as seen through the voltage divider prior to setting the ratio correction factors. In alternate embodiments, the high voltage input is the load connection 515 of the recloser 505, and the first voltage measurement represents the actual value of high voltage applied to the load connection 515 of the recloser 505. In some embodiments, the high voltage can be applied to the load connection 515 and the line connection 510 simultaneously.

At block 910, a second voltage measurement at the output of the voltage adjustment circuit 250 is determined. For example, the calibration controller 820 may receive a signal from the recloser controller 540 indicating a voltage reading of the output of the voltage adjustment circuit 250 taken by the voltage measurement circuit 225. In some embodiments, the second voltage measurement represents an (uncalibrated) measurement of the high voltage applied to the line connection 510 of the recloser 505 taken by the voltage measurement system 200.

At block 915, a difference between the first and second voltage measurements is calculated (for example, by the calibration controller 820). This difference represents the measurement error of the voltage measurement system 200.

For example, the voltage measurement system 200 may be designed such that voltage divider formed by the first voltage sensor 525 (and the capacitor 245 (C3) in the junction circuit 220) provides a voltage ratio of 10,000 to 1. However, due to the process variations of the components of the first voltage sensor 525 (and the capacitor 245 (C3) in the junction circuit 220), this voltage divider may actually provide a voltage ratio of 10,000 to 1.035. Thus, when 10,000 volts is applied to the line connection 510 of the recloser 505, the first voltage measurement (measured, for example, by the voltage divider 810) would be 10,000 volts and the second voltage measurement (measured, for example, by the voltage measurement system 200) would indicate 10,350 volts. The 350 volt difference between the first and second voltage measurements represents the error in the voltage measurement.

At block 920, a target voltage gain for the voltage adjustment circuit 250 is determined based on the difference between the first and second voltage measurements. As described above, the difference between the first and second voltage measurements represents, among other things, the variation in the voltage ratio of the voltage divider circuit 215. Thus, the calibration controller 820 may determine a target voltage gain for the voltage adjustment circuit 250 that offsets this variation. In some embodiments, the calibration controller 820 determines the target voltage gain VT_Gain for the voltage adjustment circuit 250 as $$VT\_Gain = V\_Out/V\_In = 1+([VM1-VM2]/VM1) \quad \text{(Equation 8)}$$

where
- V_Out=output voltage of the voltage adjustment circuit 250,
- V_In=input voltage of the voltage adjustment circuit 250,
- VM1=first voltage measurement, and
- VM2=second voltage measurement.

For example, when the first and second voltage measurements are 10,000 volts and 10,350 volts, respectively, the calibration controller 820 may determine a target voltage gain of 0.965 for the voltage adjustment circuit 250 (i.e., 1+([10,000−10,350]/10,000)).

At block 925, the voltage ratio of the voltage divider is adjusted by setting the voltage adjustment circuit 250 to the target voltage gain. In some embodiments, the voltage adjustment circuit 250 is set to the target voltage gain by setting a resistance of a dip-switch resistor array included in some embodiments of the voltage adjustment circuit 250. For example, with reference to the voltage adjustment circuit 300 in FIG. 3, the calibration controller 820 may determine a target closed loop gain for the operational amplifier 325 such that the voltage gain of the voltage adjustment circuit 300 is set to the target voltage gain. The calibration controller 820 may then determine a target resistance for the dip-switch resistor array 305 such that the closed loop gain of the operational amplifier 325 is set to the target closed loop gain. The calibration controller 820 may then determine a configuration of the three switches SW1, SW2, and SW3 such that the resistance across the dip-switch resistor array 305 is set to the target resistance. For example, when the target resistance is equal to the combined series resistances of the resistor Rf1 and the resistor Rf3, the calibration controller 820 may determine that the switches SW1 and SW3 should be in the open position and the switch SW2 should be in the closed position. In some embodiments, the calibration controller 820 presents the determined configuration of the switches SW1, SW2, and SW3 to a user. For example, the calibration controller 820 may display the determined configuration of the switches SW1, SW2, and SW3 to a user on a display screen included in some embodiments of the calibration controller 820.

In alternate embodiments, the voltage adjustment circuit 250 is set to the target voltage gain by setting a resistance of a digital potentiometer included in some embodiments of the voltage adjustment circuit 250. For example, with reference to the voltage adjustment circuit 400 in FIG. 4, the calibration controller 820 may determine a target closed loop gain for the operational amplifier 425 such that the voltage gain of the voltage adjustment circuit 400 is set to the target voltage gain. The calibration controller 820 may then determine a target resistance for the digital potentiometer 405 such that the closed loop gain of the operational amplifier 425 is set to the target closed loop gain. The calibration controller 820 may then send a control signal to the digital potentiometer 405 which causes the digital potentiometer 405 to set its resistance to the target resistance.

In some embodiments, the recloser controller 540 may perform all (or any portion) of the method 900 described above. For example, the recloser controller 540 may be configured to determine the target voltage gain and set the voltage adjustment circuit 250 to the target voltage gain.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The phrase "electrically coupled in series" as used herein refers to a circuit arrangement in which the described elements are arranged, in general, in a sequential fashion such that the output of one element is electrically coupled to the input of another, though the same current may not pass through each element. For example, additional circuit elements may be electrically coupled in parallel with one or more of the elements "electrically coupled in series." Furthermore, additional circuit elements can be electrically connected in series at nodes such that branches in the circuit are present. Therefore, elements electrically coupled in series do not necessarily form a true series circuit.

Additionally, the phrase "electrically coupled in parallel" as used herein refers to a circuit arrangement in which the described elements are arranged, in general, in a manner such that one element is electrically coupled to another element, such that the circuit forms a parallel branch of the circuit arrangement. In such a configuration, the individual elements of the circuit may not have the same potential difference across them individually. For example, in a parallel-type configuration of the circuit, two circuit elements electrically coupled in parallel with one another may be electrically coupled in series with one or more additional elements of the circuit. Therefore, elements electrically coupled in parallel do not necessarily individually form a true parallel circuit.

It will be appreciated that some embodiments may be comprised of one or more generic or specialized processors (or "processing devices"), for example, microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising an electronic processor) to perform a method as described and claimed herein. Examples of such computer-readable storage mediums include, but are not limited to, a hard disk, a CD-ROM, an optical storage device, a magnetic storage device, a ROM, a programmable read-only memory (PROM), an EEPROM, an erasable programmable read-only memory (EPROM), and a Flash memory.

Various features and advantages are set forth in the following claims.

We claim:

1. A switchgear system comprising:
   a switchgear device;
   a voltage divider circuit including an output and an input electrically coupled to the switchgear device; and
   a junction circuit including
     an input electrically coupled to the output of the voltage divider circuit,
     a voltage adjustment circuit configured to adjust a voltage ratio of the voltage divider circuit, the voltage adjustment circuit including an adjustable impedance component, and
     an output electrically coupleable to a voltage measurement circuit.

2. The switchgear system of claim 1, wherein the switchgear device includes a three phase recloser, and wherein the input of the voltage divider circuit is electrically coupled to a line connection of one phase of the three phase recloser.

3. The switchgear system of claim 1, wherein the switchgear device includes a recloser, and wherein the voltage measurement circuit is included in a recloser controller.

4. The switchgear system of claim 1, wherein the voltage adjustment circuit includes a dip-switch resistor array configured to adjust a voltage gain of the voltage adjustment circuit.

5. The switchgear system of claim 1, wherein the voltage adjustment circuit includes a digital potentiometer configured to adjust a voltage gain of the voltage adjustment circuit.

6. The switchgear system of claim 5, wherein the digital potentiometer is configured to
   receive a control signal, and
   set a resistance of the digital potentiometer based on the control signal.

7. The switchgear system of claim 6, wherein the control signal is determined based on a voltage measured by the voltage measurement circuit.

8. The switchgear system of claim 1, wherein the voltage divider circuit includes a capacitive voltage divider network.

9. The switchgear system of claim 8, wherein a first capacitor of the junction circuit is electrically coupled in parallel to a second capacitor of the capacitive voltage divider network.

10. The switchgear system of claim 9, wherein the voltage adjustment circuit is electrically coupled in series with the first capacitor.

11. The switchgear system of claim 7,
    wherein the voltage divider circuit is a capacitive voltage divider circuit; and
    wherein the junction circuit includes
      a capacitor electrically coupled between an output of the capacitive voltage divider circuit and a reference terminal, and
      wherein the voltage adjustment circuit is electrically coupled between the output of the capacitive voltage divider circuit and the output of the junction circuit.

12. The switchgear system of claim 11, wherein the adjustable impedance component includes a dip-switch resistor array.

13. The switchgear system of claim 11, wherein the adjustable impedance component includes a digital potentiometer.

14. The switchgear system of claim 13, wherein the digital potentiometer is configured to
    receive a control signal, and
    set a resistance of the digital potentiometer based on the control signal.

15. The switchgear system of claim 14, wherein the control signal is determined based on a voltage measured at the output of the junction circuit.

16. The switchgear system claim 11, wherein the junction circuit is configured to
    measure a temperature of at least one selected from a group consisting of the junction circuit and the capacitive voltage divider circuit, and
    set the voltage gain of the voltage adjustment circuit based on the temperature.

17. The switchgear system of claim 1, wherein the adjustable impedance component is configured to adjust a voltage gain of the voltage adjustment circuit.

18. A switchgear system comprising:
    a switchgear device;
    a voltage divider circuit including an output and an input electrically coupled to the switchgear device; and
    a junction circuit including
      an input electrically coupled to the output of the voltage divider circuit,
      a voltage adjustment circuit configured to adjust a voltage ratio of the voltage divider circuit, and
      an output electrically coupleable to a voltage measurement circuit,
    wherein the voltage divider circuit is a capacitive voltage divider circuit; and
    wherein the junction circuit includes
      a capacitor electrically coupled between an output of the capacitive voltage divider circuit and a reference terminal, and
      wherein the voltage adjustment circuit is electrically coupled between the output of the capacitive voltage divider circuit and the output of the junction circuit, the voltage adjustment circuit including an adjustable impedance component configured to adjust a voltage gain of the voltage adjustment circuit.

19. The switchgear system of claim 18,
    wherein the junction circuit includes
      a temperature sensor configured to measure a temperature of the junction circuit.

20. The switchgear system of claim 18,
    wherein the junction circuit includes
      a temperature sensor configured to measure a temperature of the voltage divider circuit.

* * * * *